Figure 1:
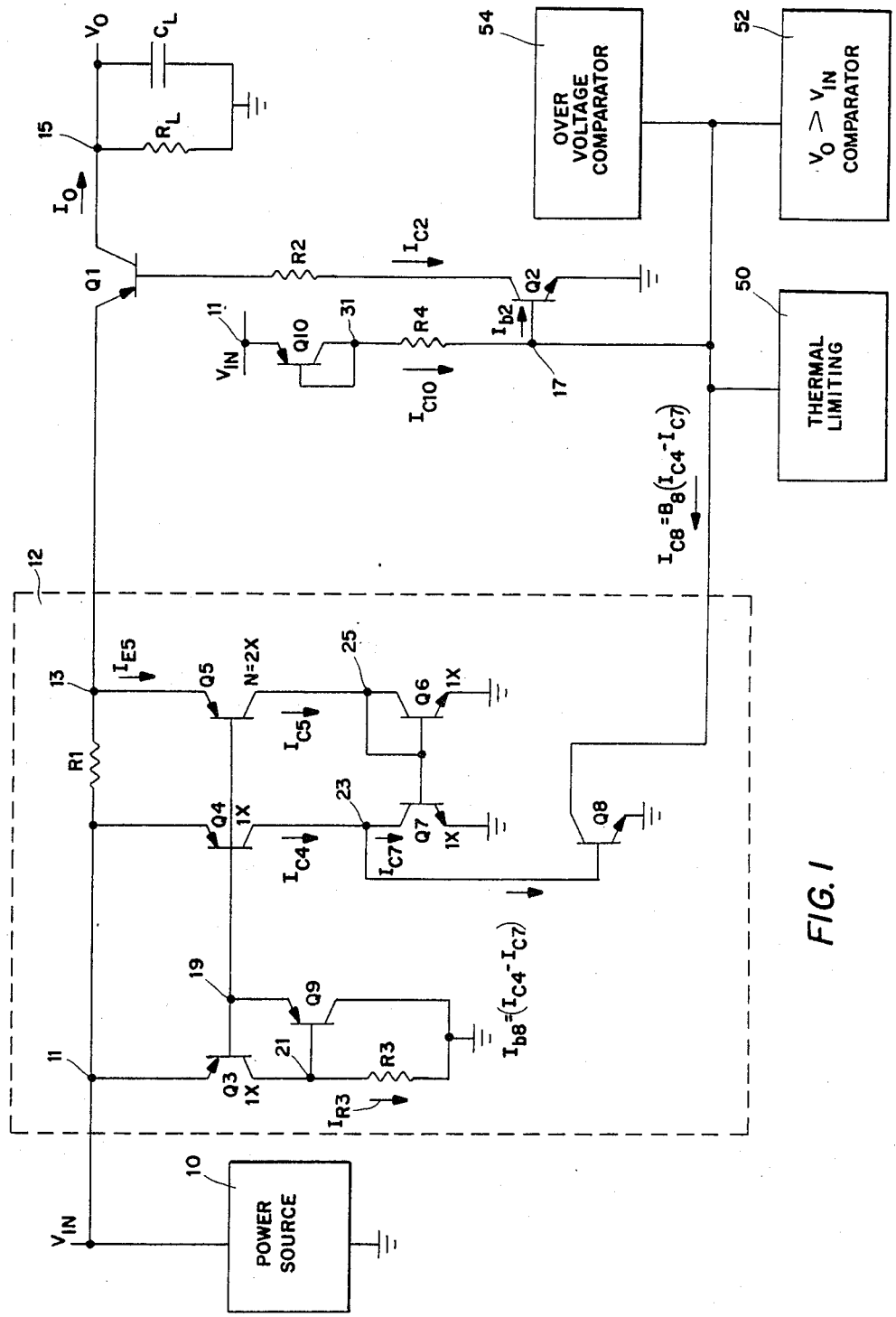

United States Patent [19]

DeShazo, Jr. et al.

[11] Patent Number: 4,672,302
[45] Date of Patent: Jun. 9, 1987

[54] CIRCUIT FOR CONTROLLING THE LOAD CURRENT LEVEL IN A TRANSISTOR

[75] Inventors: Thomas R. DeShazo, Jr., Kingwood Township, Hunterdon County; Raymond L. Giordano, Raritan Township, Hunterdon County, both of N.J.

[73] Assignee: RCA Corporation, Somerville, N.J.

[21] Appl. No.: 836,829

[22] Filed: Mar. 6, 1986

[51] Int. Cl.$^4$ .............................................. G05F 1/573
[52] U.S. Cl. .................................... 323/277; 323/285; 361/18; 361/98
[58] Field of Search ................... 361/18, 98; 323/274, 323/276, 277, 278, 284, 285, 282

[56] References Cited

U.S. PATENT DOCUMENTS

| | | | |
|---|---|---|---|
| 3,796,943 | 3/1974 | Nelson et al. | 361/18 |
| 4,311,954 | 1/1982 | Capel | 323/284 |
| 4,428,016 | 1/1984 | Brasfield | 361/18 |
| 4,567,537 | 1/1986 | Kalkhof et al. | 361/18 |

Primary Examiner—William H. Beha, Jr.
Attorney, Agent, or Firm—Henry I. Schanzer; Birgit E. Morris; Stanley C. Corwin

[57] ABSTRACT

A circuit for limiting the load current through a transistor switch, where the load is connected between the collector of the transistor switch and a first power terminal and a resistive element, whose impedance is much less than that of the load, is connected between the emitter of the transistor switch and a second power terminal. The circuit includes first and second comparator transistors, with the emitter of the first transistor being connected to the emitter of the transistor switch and the emitter of the second transistor being connected to the second power terminal. The same potential is applied to the bases of the first and second comparator transistors whereby the difference between their base-to-emitter voltages is equal to the voltage drop across the resistive element. The collector currents of the first and second transistors are compared and the difference in the currents is used to control the conductivity of the transistor switch.

4 Claims, 2 Drawing Figures

CIRCUIT FOR CONTROLLING THE LOAD CURRENT LEVEL IN A TRANSISTOR

This invention relates to means for limiting the current conducted via a transistor switch into, or out of, a load.

In many applications, it is desirable and/or necessary to couple a driving voltage to a load via a controllable switch and to sense the current level through the switch. It is particularly desirable to sense when the current through the switch exceeds a certain value and to then decrease the conductivity of the switch to thereby limit the current through the switch. For example, it is desirable to sense if, and when, a load is short circuited or drawing excessive current to prevent the flow of short-circuit, or large, currents out of the driving source and through the switch.

Sensing a short-circuit (or very large) current is problematic where, as in automotive applications, large currents may have to flow through the switch and load and the system requirements prohibit the connection of an element (e.g. a resistor) having any significant impedance in series with the load. By way of example, the impedance of the element must be so low (e.g. 0.02 ohm) that even under excessive current conditions the voltage drop cannot be more than a few tenths of a volt. This requirement makes it difficult to sense a short-circuit on the load side of a switch, since the voltage drop across the element, even for large currents flowing therethrough, is very low.

The use of the switch itself to sense the load current is also problematic. In high current systems, the voltage drop across the switch must also be low. For example, where the switch is a bipolar transistor it is normally operated in saturation when turned-on and carrying a load current. This makes it impossible to sense the current through the bipolar-transistor-switch by means of a "current mirror" coupled across the transistor-switch because the mirrored current does not reflect the load current through the saturated-transistor-switch.

These problems are resolved in circuits embodying the invention by sensing the current level on the input side of the switch (away from the load) and by use of a unique comparator means for sensing the current flowing through the switch.

Figure 2:
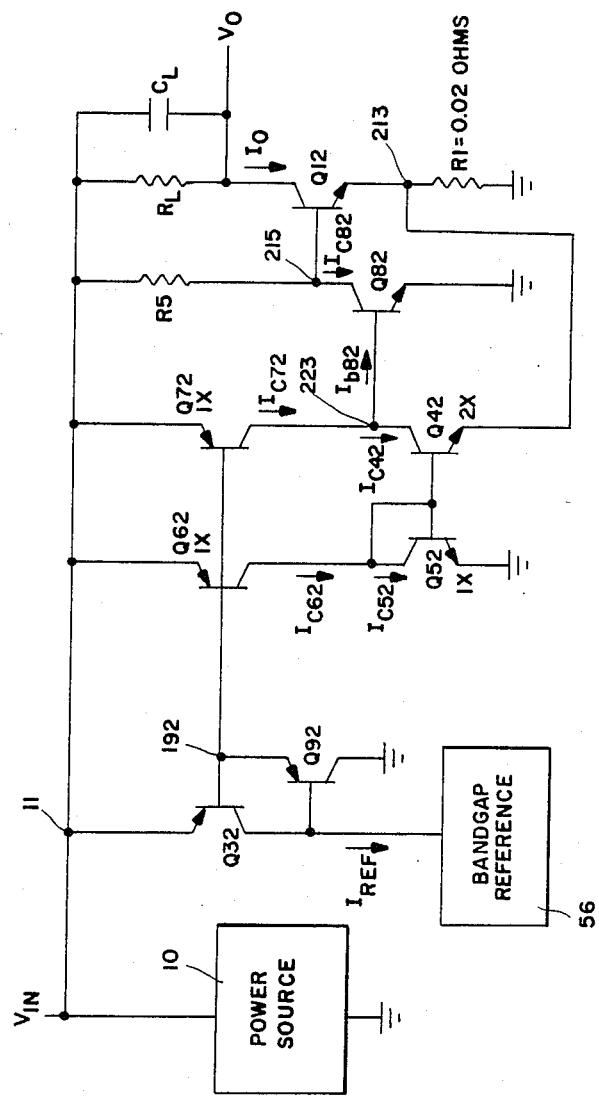

In the accompanying drawing, like reference characters denote like components, and FIG. 1 is a schematic diagram of a current limiter circuit embodying the invention; and FIG. 2 is a schematic diagram of another circuit embodying the invention.

The circuit of FIG. 1 includes an input terminal 11 to which is applied a power source 10 which, for example, may be a car battery. The input terminal 11 is coupled via a current limiting resistor R1 to a node 13 to which is connected the emitter of a switching PNP transistor Q1 whose collector is connected to an output terminal 15. The current limiting resistor R1 is made equal to 0.02 ohms whereby even when a large current flows through it, the voltage drop is very small, (e.g., for a current of 10 amperes flowing through Q1 and into the load the voltage drop across R1 is volts). The load connected between terminal 15 and ground is represented by a resistor $R_L$ across which is connected a filtering and energy storage capacitor $C_L$. Although the load is represented by a resistor $R_L$, it may be, in practice, any one of a number of known elements.

Transistor Q1 is normally turned-on by means of a circuit comprising PNP bipolar transistor Q10, a resistor R4, an NPN bipolar transistor Q2 and a resistor R2. Transistor Q10 is connected at its emitter to terminal 11 and its base and collector are connected to node 31 to which is connected one end of current setting resistor R4. The other end of R4 is connected to node 17 to which is connected the base of transistor Q2 whose emitter is grounded. The collector of Q2 is connected via resistor R2 to the base of transistor Q1. Normally, a current $I_{c10}$ which is equal to $[V_{IN}-2V_{BE}]/R4$ (where R4 is the ohmic value of R4) flows via the emitter-to-collector of Q10 and via R4 into node 17.

Assuming Q8 to be non-conducting and assuming further that the other circuits (i.e. thermal limiting circuit 50, $V_O>V_{IN}$ comparator 52, and overvoltage comparator 54) connected to node 17 draw no current out of the node (or even supply current into the node), $I_{c10}$ then flows as $I_{b2}$ into the base of Q2 causing an amplified current, $I_{c2}$, to flow in the collector of Q2. The current $I_{c2}$, drawn from the base of Q1 causes an amplified current $I_o$ to flow out of the collector of Q1 into terminal 15 and the load, $R_L$. $I_{c2}$ is of sufficient amplitude to normally drive Q1 into saturation whereby its collector-to-emitter drop is relatively small (e.g. 0.3 to 0.8 volt).

Since Q1 is operated in saturation, it is possible for relatively large load currents to flow via the emitter-to-collector of Q1 if, and when, the load is wholly or partly short circuited. For example, assume that it is desired to have a nominal $I_o$ of 0.8 amperes when $V_{IN}$ is 10 volts and $R_L$ is 12.5 ohms, and that the forward current gain ($\beta 1$) of Q1 is, typically, equal to 20.

To ensure that Q1 is driven into saturation, a base current (i.e. $I_{c2}$) greater than 40 milliamperes is normally drawn out of the base of Q1. Due to the wide range over which $V_{IN}$ may vary and assuming a worst case $\beta 1$ of 10 (rather than the typical 20) $I_{c2}$ may be designed to be 100 milliamperes when $V_{IN}$ is equal to 10 volts. Consequently, if $R_L$ is partly or wholly shorted and $\beta 1$ is, in fact, equal to 30, a current $I_o$ can flow into terminal 15 and load $R_L$, via the emitter-to-collector of Q1, having an amplitude of 3 amperes, rather than the nominal 0.8 amperes. In many instances, it is necessary and/or desirable that the load current does not exceed a given level which assume, for example, is 1.2 amperes.

The current limiter circuit 12 functions to sense when the emitter-to-collector current ($I_o$) of Q1 exceeds a given value (e.g., 1.2 amperes), and to then decrease the conductivity of Q1 limit the $I_O$ current. The current limiting circuitry includes PNP bipolar transistors Q3, Q4, Q5 and Q9, NPN bipolar transistors Q6, Q7 and Q8 and a resistor R3. The emitters of transistors Q3 and Q4 are connected to terminal 11 and their bases are connected in common to a biasing node 19 to which is also connected the base of Q5 and the emitter of transistor Q9 whose base is connected to the collector of Q3 at node 21. A current setting resistor, resistor R3, is connected between node 21 and ground. The collector of transistor Q4 is connected to a node 23 to which is connected the collector of Q7 and the base of Q8. The emitters of Q6, Q7 and Q8 are connected to ground potential. The base of Q7 is connected to a node 25 to which is also connected the base and collector of Q6 and the collector of Q5. The emitter of transistor Q5 is connected to node 13 and the collector of Q8 is connected to node 17.

The relative physical size of the transistors, where pertinent, are shown in FIG. 1 by the letter "x" preceded by a numeral (e.g., 1×, 2×). The physical size of a device is proportional to numeral preceding the letter "x"; (i.e. a 2× device has twice the emitter area of a 1× device), and an Nx sized device conducts N times the current of an "x" size device for like bias conditions. For reasons discussed below, the physical size of Q5 is twice (i.e. 2×) that of Q4 and Q3 (i.e., 1×) while Q6 and Q7 are made the same size (i.e., each 1×).

In the discussion to follow, assume that the forward current gain ($\beta_N$) of the NPN transistors are all equal to each other and that the forward current gain ($\beta_P$) of the PNP transistors are all equal to each other.

As noted above, under "normal" conditions, a current ($I_o$) flows from power source 10 via R1, and the emitter-to-collector of Q1 into terminal 15 and load $R_L$. If Q1 is in saturation, $I_o$ is approximately equal to $[V_{IN}-V_{Q1SAT}]/R_L$; where $V_{Q1SAT}$ is the collector-to-emitter saturation voltage of Q1 which may be in the range of 0.3 to 0.8 volt, and where R1 is neglected as being much $R_L$. For purpose of example, assume, as above, that the nominal value of $I_o$ is 800 milliamperes. $I_o$, the emitter current ($I_{E5}$) of Q5 and the base current ($I_{c2}$) of Q1 flow through R1 which is equal to 0.02 ohms and produce a voltage drop ($V_{R1}$) equal to ($I_o+I_{E5}I_{c2}$)(R1). However, where $I_o$ is in the range of 800 milliamperes, $I_{E5}$ and $I_{c5}$ may be neglected relative to $I_o$ since their effect on $V_{R1}$ is not significant, (where $I_{c2}$ is in the order of 20 to 40 milliamperes and $I_{E5}$ is in the order of a milliampere).

The voltage drop, $V_{R1}$, across R1 functions as a signal input applied to, or across, the emitters of Q4 and Q5 which, in turn, function as the inputs of a comparator. The effect of $V_{R1}$ on the operation of limiter circuit 12, the use of $V_{R1}$ to sense when the current $I_o$ exceeds a preset limit, and the response of the circuit 12 to the sensed excess current is now examined in greater detail.

Transistors Q3 and Q9 are interconnected to produce a current $I_{R3}$ in R3 which is essentially equal to $[V_{IN}-V_{BE3}-V_{BE9}]/R3$; where $V_{BE3}$ and $V_{BE9}$ are the $V_{BE}$'s of Q3 and Q9, respectively. The ohmic value of R3 may be selected to produce a desired $I_{R3}$. The current $I_{R3}$ which may be assumed to be a reference current, $I_{REF}$, is essentially equal to the current $I_{c3}$ out of the collector of Q3.

Since the base and emitter of Q4 are connected to the base and emitter, respectively, of Q3 and since Q4 is the same size, and of the same conductivity type, as Q3, its collector current ($I_{c4}$) is essentially equal to $I_{c3}$ which is equal to $I_{REF}$. The current $I_{c4}$ then flows (or is "sourced") into a current summing node 23. The $I_{c4}$ current sourced into node 23 is compared to a current $I_{c7}$ which is drawn ("sunk") out of node 23 by transistor Q7. So long as $I_{c7}$ is greater than $I_{c4}$, more current is sunk out of node 23 than is sourced into node 23 and the potential at node 23 is then at, or close to, ground potential. When $I_{c7}$ is less than $I_{c4}$, more current is sourced into node 23 than is sunk out of the node by Q7, the potential at node 23 then rises and a difference current ($I_{c4}-I_{c7}$) then flows as $I_{b8}$ into the base of Q8.

For the circuit configuration of FIG. 1, Q7 mirrors the ourrenl in Q6 and, where Q7 is made the same geometry as Q6, the collector current ($I_{c7}$) sunk by Q7 is essentially equal to the collector current ($I_{c6}$) of Q6.

Furthermore, for the circuit configuration of Figure 1, the collector current $I_{c6}$ of Q6 is essentially egual to the collector current ($I_{c5}$) of Q5, whereby $I_{c7}$ is equal to $I_{c6}$ which is equal to $I_{c5}$. Thus, in essence, the collector current ($I_{c4}$) of Q4 is compared to lhe collector current ($I_{c5}$) of Q5 at node 23.

Ihe operation of the comparator and how the current throu0h R1 is sensed will now be explained by first assuming a condition when $V_{R1}$ is at, or close to, zero volts, although this condition cannot exist in practice, since for $V_{R1}$ to be zero, $I_o$, $I_{E5}$ and $I_{c2}$ must be zero.

When $V_{R1}$ is equal to zero volts, the emitter of Q5 is essentially at the same potential as the emitters of Q3 and Q4. Since the bases of Q3, Q4 and Q5 are connected in common at node 19, their base-to-emitter potentials are then essentially equal. For the voltage condition of $V_{R1}=0$ volt, and assuming Q5 to be made twice (i.e. N=2) the physical size of Q3 (or Q4), the collector current ($I_{c5}$) in Q5 is essentially twice the amplitude of the collector current $I_{c4}$ in Q4; (i.e. $I_{c5}=2I_{c4}$). Since $I_{c7}$ is equal to $I_{c5}$, it is clear that for this condition more current is sunk out of node 23 than is sourced and there is no base current ($I_{b8}$) into the base of Q8.

It is evident that the flow of $I_o$ causes a voltage drop in the emitter voltage of Q5. Clearly, as $I_o$ increases, the emitter voltage (at node 13) of Q5 decreases relative to the emitter voltage of Q4 and Q3. Decreasing the emitter voltage of Q5 while maintaining its base voltage equal to that of Q3 and Q4 causes the $V_{BE}$ of Q5 to decrease relative to the $V_{BE}$ of Q3 and Q4. This decrease in the $V_{BE}$ of Q3 causes its collector current to decrease. By maintaining the base voltage of Q5 equal to that of Q4 and by applying the input signal (i.e. $V_{R1}$) across their emitters, the emitter-collector current of Q5 may be compared with that of Q4 to produce a very sensitive and responsive arrangement. Note, in the circuit of FIG. 1, since the bases of Q4 and Q5 are held at the same potential, and since the voltage difference between their emitters is essentially equal to ($I_o$)(R1), the variations in the current $I_{R3}$ and in the voltage level at node 19 does not significantly affect the operation of the comparison functlon of Q4 and Q5.

The potentials developed across the base-to-emitter of Q4 and Q5 may be expressed in terms of the current through R1 as follows:

$$V_{BE4}=V_{BE5}+(I_{E5}+I_o+I_{c2})(R1) \qquad \text{Eq. 1}$$

$V_{BE4}$ and $V_{BE5}$ are the $V_{BE}$'s of Q4 and Q5, respectively.

When $I_o$ is, for example, in the range of 800 milliamperes, the $I_{E5}$ and $I_{c2}$ terms may be neglected, and equation 1 may then be solved for $I_o$ as follows:

$$I_o \cong [V_{BE4}-V_{BE5}]/R1 \qquad \text{Eq. 2}$$

$I_o$ amy be expressed in terms of the ratio of the currents in Q4 and Q5 and their relative sizes as follows:

$$I_o = \frac{V_T}{R_1} \ln\left[N \cdot \frac{I_{c4}}{I_{c5}}\right] \qquad \text{Eq. 3}$$

Where
$V_T=\eta KT/q \cong 34.6$ millivolts at 25° C.; and
N=ratio of geometry of Q5 to that of Q4.

It is evident from equations 1, 2 and 3 and from an analysis of the circuit, that as $I_o$ increases, $V_{R1}$ increases, decreasin $V_{BE5}$ relative to $V_{BE4}$. Some typical values of $I_{c5}$ relative to $I_{c4}$ for different values of $I_o$ for the condition when R1 is 0.02 ohms and Q5 is twice the size of Q4 are given in TABLE 1 below.

TABLE 1

| $I_o$ | $V_{BE} - V_{BE5} = V_{R1}$ | $I_{c5}$ | $I_{c4}$ | $I_{b8}$ |
|---|---|---|---|---|
| 0 | 0 | 2 ma | 1 ma | −1 ma |
| 0.6 A | 12 millivolts | 1.414 ma | 1 ma | −.414 ma |
| 0.8 A | 16 millivolts | 1.260 ma | 1 ma | −.260 ma |
| 1.2 A | 24 millivolts | 1 ma | 1 ma | 0 |
| 1.8 A | 36 millivolts | 0.707 ma | 1 ma | +.293 ma |

Note from Table 1, that, although $V_{R1}$ changes relatively little in an absolute sense while the current $I_o$ changes drastically, for each 12 millivolt increase in $V_{R1}$, $I_{c5}$ decreases by a factor of $1/\sqrt{2}$. Note further that until $I_{c5}$ decreases to the point that $I_{c5}=I_{c4}$, $I_{c7}$ is greater than $I_{c4}$ and no base drive is supplied (i.e., $I_{b8}$ is negative) into the base of Q8. However, as soon as $I_{c5}$ becomes less than $I_{c4}$, current flows from node 23 into the base of Q8.

As soon as current flows into the base of Q8, Q8 draws its collector current out of the base of Q2 decreasing the conductivity of Q2 and hence decreasing the current level through Q1.

For the conditions set forth in TABLE 1, above, and with the feedback loop connected in the circuit (i.e. node 23 is connected to the base of Q8), the current $I_o$ that can flow in the output circuit can rise to just above 1.2 amperes. As $I_o$ tries to increase above that value, conduction through Q5 decreases whereby $I_{c7}$ becomes less than $I_{c4}$, and a current $I_{b8}$ flows into the base of Q8 decreasing the base drive to Q2 and Q1 and ensuring that the current through Q1 is prevented from rising much above brought into balance by passing a current in a resistor connected in the emitter of one of two transistors forming the mirror. The switching point of the current mirror is reached when $I_{c4}$ is equal to $I_{c7}$.

The switching point of the comparator (i.e. when $I_{c4}=I_{c5}$ or $I_{c7}$) occurs in the circuit of FIG. 1, for the values given, when $I_o=1.2$ amperes. However, it should be evident that the point can be designed to occur at a different point by making the size of Q5 a different ratio ("N" other than 2) of Q4. The value of $I_o$ at which the switching point occurs can also be raised or lowered by making R1 a smaller or larger impedance.

Once the switching point is reached, if $I_o$ tries to increase above the desired level, $V_{R1}$ also increases. The potential across the base-and-emitter of Q5 then decreases further and the difference current into the base of Q8 increases causing a decrease in the base drive to Q2 and Q1 and forcing $I_o$ to be held at, or close to, the 0 desired level.

In the circuit of FIG. 1, a PNP switching transistor Q1 was used to couple $V_{IN}$ to the load. In FIG. 2, an NPN power transistor Q12 is used as the power switch with load resistor $R_L$ being connected between terminal 11 and the collector of Q12 and a resistor R1 of 0.020 ohms being connected between the emitter of Q12 and g Q12 is ormally turned-on by means of a current source, represented by R5 in FIG. 2, connected between terminal 1 and a node 215 to whioh are also connected the base of Q12 and the collector of a control transistor Q82. The network producing the reference current includes NP transistors Q32 and Q92. The emitter of Q32 is connected to terminal 11 and its base is connected to the emitter of Q92 at node 192. A bandgap reference circuit 56 is connected to the collector of Q32 and the base of Q92. The bandgap reference circuit 56 produces a current $I_{REF}$, which flows in the collector of Q32. Transistor Q92 functions t compensate for base current errors caused by the base currents of Q32, Q62 and Q72.

The comparator circuitry includes PNP transistors Q62, and Q72, each of which is of the same geometry as Q32, and NPN transistors Q52, Q42 and Q82. Q42 is made twice (2x) the size of Q52 whereby for like bias conditions, Q42 conducts twice the current of Q52.

The bases of Q62 and Q72 are connected to the base of Q32 at node 192 and their emitters are connected to terminal 11 to which the emitter of Q32 is also connected. Mence the current $I_{REF}$ is "mirrored" in the collectors of Q72 and Q62 and, when the devices are of equal geometry, the collector current ($I_{c62}$) in Q62 is equal to the collector current ($I_{c72}$) in Q72, each being essentially equal to $I_{REF}$.

$I_{c62}$ flows into the collector and base of Q52 and into the base of Q42. The collector current ($I_{c52}$) in Q52 is essentially equal to $I_{dc62}$. The collector of Q72 is connected to a summing node 223 and its collector current ($I_{c72}$) is sourced into node 223. The collector of Q42 is connected to node 223 whereby its collector current ($I_{c42}$) is drawn (sunk) out of node 223. The emitter of Q42 is connected to the emitter of Q12 and one end of resistor R1 at node 213.

R1, as in FIG. 1, is assumed equal to 0.02 ohms. Mowever, it should be noted that the ohmic value cf R1 could be increased or decreased to some degree. The general requirement, in FIGS. 1 and 2, being that R1 must be a very small percentage of the load impedance. As in FIG. 1, it is tacitly assumed, for ease of explanation, that the collector current ($I_o$) of Q12 is essentially equal to its emitter current ($I_E$) since the error resulting from this assumption is typically less than 10%.

For small values of $I_o$, the base-to-emitter voltage of Q42 is nearly equal to the $V_{BE}$ of Q52. Mowever, since Q42 is a larger device than Q52, it oonducts a greater current than Q52. Mence, the current "sunk" out of node 223 by Q42 is greater than the current sourced into the node by Q72. The potential at node 223 and the difference current ($I_{c72}-I_{c42}$) is then of a polarity and magnitude to hold Q82 turned-off.

Note that while Q82 is turned-off, a base current is supplied via R5 into the base of Q12. Q12 amplifies this base current and produces the current to $I_o$ flowing through the load and via R1 to ground.

As in the circuit of FIG. 1, if $I_o$ increases (for whatever reason) above a certain desired level, a voltage $V_{R1}$) is developed across R1 which decreases the base-to-emitter potential of Q42 to the point that its collector current ($I_{c42}$) is equal to $I_{c72}$. Any further increase in $I_o$, causing $V_{R1}$ to increase further, causes more current to be "sourced" into node 223 than "sunk" out of the node. The difference current ($I_{c72}-I_{c42}$) then flows into the base of Q82 which draws its collector current out of node 215 decreasing the base drive to Q12. This obviously tends to maintain $I_o$ at a value close to the desired level.

What is claimed is:
1. The combination comprising:
  first and second terminals for the application therebetween of an operating potential;
  a power transistor having a base, an emitter and a collector;
  means for connecting a load between the collector of said power transistor and said first power terminal;

a resistive element having an impedance which is significantly less than the impedance of said load;

means connecting one end of said resistive element to the emitter of said power transistor at a first node, and means connecting the other end of said resistive element to said second power terminal;

means for measuring the load current through said resistive element and for controlling the conductivity fo said power transistor as a function of the current level through said resistive element including:

first and second comparator transistors, each comparator transistor having a base, an emitter and a collector;

means connecting the emitter of said first comparator transistor to said first node and the emitter of said second comparator transistor to said second power terminal;

means for applying the same relatively constant biasing potential to the bases of said first and second comparator transistors for maintaining the collector-to-emitter current through said second comparator transistor relatively constant and for enabling the current through said first comparator transistor to vary as a function of the total current through said resistive element; and means coupled to the collectors of said first and second comparator transistors for comparing their collector currents and including means responsive to the difference between their collector currents for producing a signal coupled to the base of said power transistor for controlling its conductivity.

2. The combination comprising:

first and second power terminals for the application therebetween of an operating potential;

a relatively low impedance element connected betwee one of said first and second power terminal and an intermediate node;

an output terminal for the connection thereto of a selectively enabled controllable switch means connec between said intermediate node and said output terminal; and means for limiting the current flowing through combination of said low impedance element and said switch means comprisin0:

(a) first and second transistors, each having a base, an emitter, and a collector; and the physical sizes of said first and second transistor being ratioed such that the collector current of said first transistor is N e collector current of said second transistor for like base-to-emitter bias conditions;

(b) means connecting the emitter of said second to said one of said first and second power (c) means connecting the emitter of said first transistor to said intermediate node for decreasing the base-to-emitter voltage of said first transistor in response to increasing values of current through said low impedance element and said switch means;

(d) means for applying the same potential to the bases said first and second transistors;

(e) a summing node;

(f) means, coupled between the collectors of said first and second transistors and said summing node, for comparing the collector currents in said first and second transistors and for producing a first valued slgnal at said summing node when the difference between the collector currents is of one polarity and a second valued signal when the difference between the collector currents is of opposite polarity to said one polarity; and means coupled between said summing node and said controllable switch means for limiting the current through said switch means, in response to the presence of said second valued signal.

3. The combination as claimed in claim 2, wherein said controllable switch means is a power transistor having a base, an emitter and a collector;

wherein the emitter of said power transistor is connected to one end of said relatively low impedance element;

wherein the collector of said power transistor is connect to the said output terminal; and said means coupled between said summing node and said controllable switch means includes means coupled to the base of said power transistor.

4. The combination as claimed in claim 3 wherein the impedance of said relatively low impedance element is a small percentage of the impedance of said load.

* * * * *

UNITED STATES PATENT AND TRADEMARK OFFICE
CERTIFICATE OF CORRECTION

PATENT NO. : 4,672,302

DATED : Jun. 9, 1987

Page 1 of 3

INVENTOR(S): DeShazo, Jr. et al.

It is certified that error appears in the above-identified patent and that said Letters Patent is hereby corrected as shown below:

Col. 1, line 63, after "is" insert --0.2--.
Col. 2, line 51, after "Q1" insert --to--.
Col. 3, line 4, after "to" insert ---the---.
Col. 3, line 22, after "much" insert --smaller than--.
Col. 3, line 27, delete "$(I_0+I_{E5}I_{c2})$" and insert --$(I_0+I_{E5}+I_{c2})$--.
Col. 3, line 63, delete "ourrenl" and insert --current--.
Col. 3, line 67, delete "egual" and insert --equal--.
Col. 4, line 2, delete "lhe" and insert --the--.
Col. 4, line 4, delete "Ihe" and insert --The--.
Col. 4, line 5, delete "throuOh" and insert --through--.
Col. 4, line 20, before "causes" delete "Q3" and insert --Q5--.
Col. 4, line 40, delete "functlon" and insert --function--.
Col. 4, line 47, before "$V_{BE4}$" insert --where--.
Col. 4, line 55, delete "amy" and insert --may--.
Col. 4, Eq. 3, delete "$\frac{V_T}{R_1} \ln$" and insert --$\frac{V_T \ln}{R_1}$--.
Col. 4, line 67, delete "decreasin" and insert --decreasing--.
Col. 5, line 33, after "above" insert --1.2 amperes.

In fact, assuming that output terminal 15 is shorted to ground, the output current $I_0$ will be held to a value approximately equal to 1.2

UNITED STATES PATENT AND TRADEMARK OFFICE
CERTIFICATE OF CORRECTION

PATENT NO. : 4,672,302

DATED : Jun. 9,1987

INVENTOR(S): DeShazo, Jr. et al.

It is certified that error appears in the above-identified patent and that said Letters Patent is hereby corrected as shown below:

amperes.

In the circuit of the invention, a current mirror is--.

Col. 5, line 40, before "point" insert --switching--.
Col. 5, line 51, delete "0".
Col. 5, line 58, delete "g" and insert --ground--.
Col. 5, line 59, delete "ormally" and insert --normally--.
Col. 5, line 60, delete "1" and insert --11--.
Col. 5, line 60, delete "whioh" and insert --which--.
Col. 5, line 63, delete "NP" and insert --PNP--.
Col. 6, line 1, delete "t" and insert --to--.
Col. 6, line 12, delete "Mence" and insert --Hence--.
Col. 6, line 19, delete "$I_{dc62}$" and insert --$I_{c62}$--.
Col. 6, line 23, delete "Mowever" and insert --However--.
Col. 6, line 28, delete "cf" and insert --of--.
Col. 6, line 37, delete "Mowever" and insert --However--.
Col. 6, line 38, delete "oonducts" and insert --conducts--.
Col. 6, line 39, delete "Mence" and insert --Hence--.
Col. 6, line 46, after "current" delete "to".
Col. 6, line 50, delete "$V_{R1}$)" and insert --($V_{R1}$)--.
Col. 7, line 10, delete "fo" and insert --of--.
Col. 7, lines 40-41, delete "betwee" and insert --between--.

UNITED STATES PATENT AND TRADEMARK OFFICE
CERTIFICATE OF CORRECTION

PATENT NO. : 4,672,302

DATED : Jun. 9, 1987

INVENTOR(S): DeShazo, Jr. et al.

It is certified that error appears in the above-identified patent and that said Letters Patent is hereby corrected as shown below:

Col. 7, line 43, after "of" insert --a load;--.
Col. 7, lines 45-46, delete "connec" and insert --connected--.
Col. 8, line 3, delete "comprisin0" and insert --comprising--.
Col. 8, line 1, after "through" insert --the series--.
Col. 8, line 8, delete "e" and insert --times the--.
Col. 8, line 10, after "second" insert --transistor--.
Col. 8, line 11, after "power" insert --terminals;--.
Col. 8, line 17, after "bases" insert --of--.
Col. 8, line 24, delete "slgnal" and insert --signal--.
Col. 8, line 41, before "said" insert --wherein--.
Col. 8, lines 39-40, delete "connect" and insert --connected--.

Signed and Sealed this

Tenth Day of May, 1988

*Attest:*

DONALD J. QUIGG

*Attesting Officer*  *Commissioner of Patents and Trademarks*